(12) United States Patent
Nishikawa

(10) Patent No.: US 9,087,802 B2
(45) Date of Patent: Jul. 21, 2015

(54) PATTERN CREATING APPARATUS AND PATTERN CREATING METHOD

(71) Applicant: Shima Seiki Mfg., Ltd., Wakayama-shi, Wakayama (JP)

(72) Inventor: Fumihiro Nishikawa, Wakayama (JP)

(73) Assignee: Shima Seiki Mfg., LTD., Wakayama-shi (JP)

( * ) Notice: Subject to any disclaimer, the term of this patent is extended or adjusted under 35 U.S.C. 154(b) by 0 days.

(21) Appl. No.: 14/186,073

(22) Filed: Feb. 21, 2014

(65) Prior Publication Data

US 2014/0297020 A1    Oct. 2, 2014

(30) Foreign Application Priority Data

Mar. 29, 2013   (JP) ................................. 2013-073063

(51) Int. Cl.
*G06F 19/00*   (2011.01)
*H01L 27/32*   (2006.01)
*H01L 51/00*   (2006.01)
*G06T 11/00*   (2006.01)
*H01L 27/12*   (2006.01)

(52) U.S. Cl.
CPC .......... *H01L 27/3276* (2013.01); *G06T 11/001* (2013.01); *H01L 27/124* (2013.01); *H01L 51/0023* (2013.01); *H01L 27/3274* (2013.01); *H01L 2227/323* (2013.01); *H01L 2251/568* (2013.01)

(58) Field of Classification Search
CPC .......... G06T 11/001; D04B 7/24; D04B 7/26; D04B 15/66
USPC .......................... 700/130–133, 136–138, 141
See application file for complete search history.

(56) References Cited

U.S. PATENT DOCUMENTS

| | | | |
|---|---|---|---|
| 5,740,057 A * | 4/1998 | Futamura ...................... 700/138 |
| 5,954,004 A * | 9/1999 | Futamura ...................... 700/138 |
| 2010/0145494 A1* | 6/2010 | Yamada ........................ 700/138 |
| 2011/0160894 A1* | 6/2011 | Yamada ........................ 700/138 |

FOREIGN PATENT DOCUMENTS

EP         1950676 A1     7/2008

* cited by examiner

*Primary Examiner* — Nathan Durham
(74) *Attorney, Agent, or Firm* — Rothwell, Figg, Ernst & Manbeck, P.C.

(57) ABSTRACT

Settings of color parameters relating to a plurality of colors and length parameters relating to lengths of line segments of the respective colors are accepted via a setting image. A Line having the plurality of colors is created by an image processing unit connecting the line segments of the respective colors to each other that respectively have the colors according to the color parameters and the lengths according to the length parameters, and a pattern with multiple lines is created by the image processing unit arranging the created line in a repeated manner in a predetermined area. Effects: Various types of cyclic patterns are automatically created.

4 Claims, 6 Drawing Sheets

28

F I G. 7
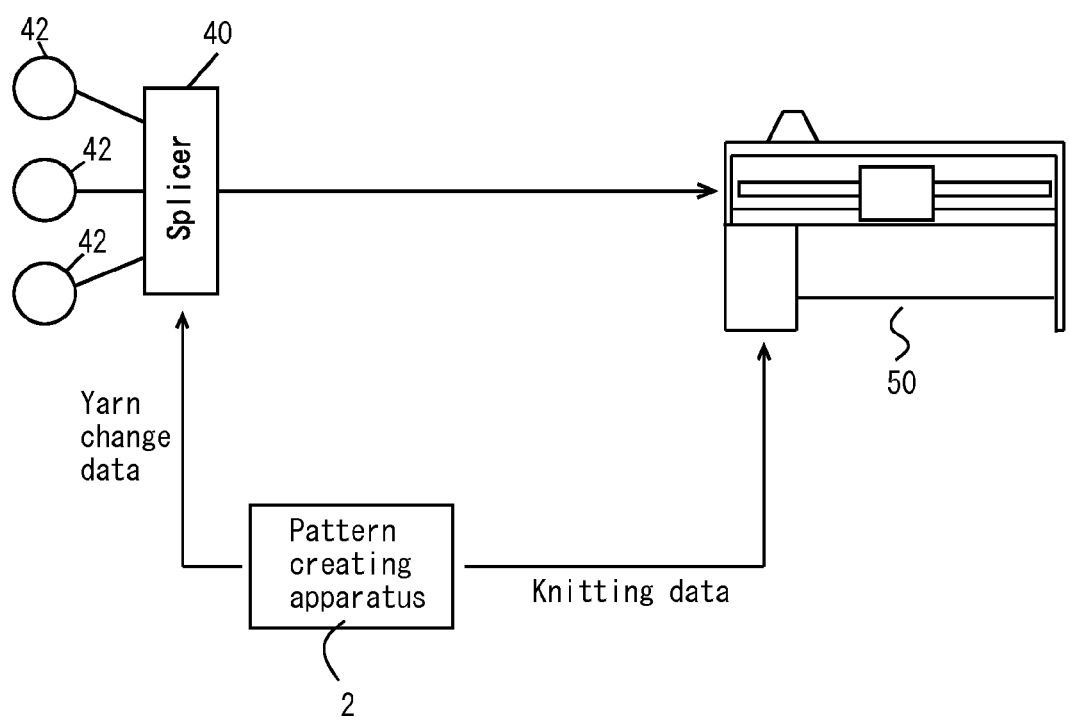

PATTERN CREATING APPARATUS AND PATTERN CREATING METHOD

BACKGROUND OF THE INVENTION

1. Field of the Invention

The present invention relates to a pattern creating apparatus that automatically creates various types of cyclic patterns for apparel and the like, and a pattern creating method.

2. Description of Related Art

There is no known apparatus that automatically creates a pattern that has a plurality of colors and in which the colors are arranged in a repeated manner with some degree of regularity. As an apparatus for creating a border pattern, an apparatus is known that extracts a color from an area designated in, for example, a natural image, and arranges the color in a repeated manner (Patent Literature 1: WO2007/58124). However, the border pattern that is created by this method is limited to that using a color contained in the natural image.

Furthermore, if colors of dots are randomly varied, the created pattern is often what cannot be described as a pattern due to extreme randomness of the colors. It is also known to create a pattern in accordance with rules such as the fractal or chaos theory, but the created pattern is often quite different from a traditional pattern such as checks or stripes.

CITATION LIST

Patent Literature

[Patent Literature 1] WO2007/58124

SUMMARY OF THE INVENTION

It is an object of the present invention to enable various types of cyclic patterns to be created automatically.

A pattern creating apparatus according to the present invention is directed to a pattern creating apparatus including:

a setting unit that creates a setting image for accepting settings of color parameters relating to a plurality of colors, and length parameters relating to lengths of line segments of the respective colors, and accepts an input of a user; and an image processing unit that creates a line having the plurality of colors by connecting the line segments of the respective colors to each other that respectively have the colors according to the color parameters and the lengths according to the length parameters, and creates a pattern with multiple lines by arranging the created line in a repeated manner in a predetermined area.

A pattern creating method of the present invention is directed to a pattern creating method including the steps for:

accepting, via a setting image, settings of color parameters relating to a plurality of colors, and length parameters relating to lengths of line segments of the respective colors; and causing an image processing unit to create a line having the plurality of colors by connecting the line segments of the respective colors to each other that respectively have the colors according to the color parameters and the lengths according to the length parameters, and to create a pattern with multiple lines by arranging the created line in a repeated manner in a predetermined area.

According to the present invention, it is possible to create dialogically and easily various types of patterns encompassing patterns like checks and stripes, patterns like waves etc., random patterns, and the like. It is also possible to create a number of patterns by changing parameters while displaying a created pattern on a color monitor or the like. Objects to which the present invention is applied include apparel, such as knitted fabrics, textiles, clothes, clothing, curtains, and car seats, posters, or the like, and the created patterns may be used, interpreting the patterns as showing not only colors of these products, for example, but also the yarn type, the stitch type, and the like. Note that lines are arranged so as to fill up an area, for example.

It is preferable that the area be a quadrangle, and the image processing unit be configured to arrange the line in parallel to a side of the area, to change a direction of the line or start a new line when the line reaches an end of the area, or an already arranged line, and to arrange a remaining part of a length of a line segment at the time of the change of the direction or the start of the new line as a first line segment of the line after the change or the start. With this configuration, it is possible to create various types of patterns in a quadrangular area.

Furthermore, it is preferable that the pattern creating apparatus further include a copy unit that extracts a region designated by the user from the created pattern, and copies the extracted region onto a design of apparel or the like. With this, it is possible to extract an arbitrary region in the created pattern, and to reflect the extracted region on a design of apparel or the like.

It is particularly preferable that the pattern creating apparatus further include a frequency analyzing unit that performs frequency analysis on the created pattern. The frequency analysis such as Fourier transformation may enable only a pattern that has strong cyclicity to be extracted.

BRIEF DESCRIPTION OF THE DRAWINGS

FIG. 7 is a diagram illustrating an example of use of the pattern creating apparatus.

FIG. 8(a) shows an example of a two color pattern based on "Increment and Restart"; FIG. 8(b) shows an example of a two color pattern based on "Increment and Restart"; FIG. 8(c) shows an example of a two color pattern based on "Increment and Restart"; FIG. 8(d) shows an example of a two color pattern based on "Increment, Decrement, and Restart"; FIG. 8(e) shows an example of a three color pattern based on "Increment, Decrement, and Restart"; FIG. 8(f) shows an example of a three color pattern based on "Increment, Decrement, and Restart"; FIG. 8(g) shows an example of a three color pattern based on "Increment, Decrement, and Restart"; FIG. 8(h) shows an example of a three color pattern based on "Increment, Decrement, and Restart"; FIG. 8(i) shows an example of a three color pattern based on "Increment, Decrement, and Restart"; FIG. 8(j) shows an example of a three color pattern based on "Increment, Decrement, and Restart"; FIG. 8(k) shows an example of a four color pattern based on "Increment, Decrement, and Restart"; and FIG. 8(l) shows an example of a pattern in which the lengths of respective line segments of two colors are randomly defined.

DETAILED DESCRIPTION OF THE INVENTION

Figure 1:
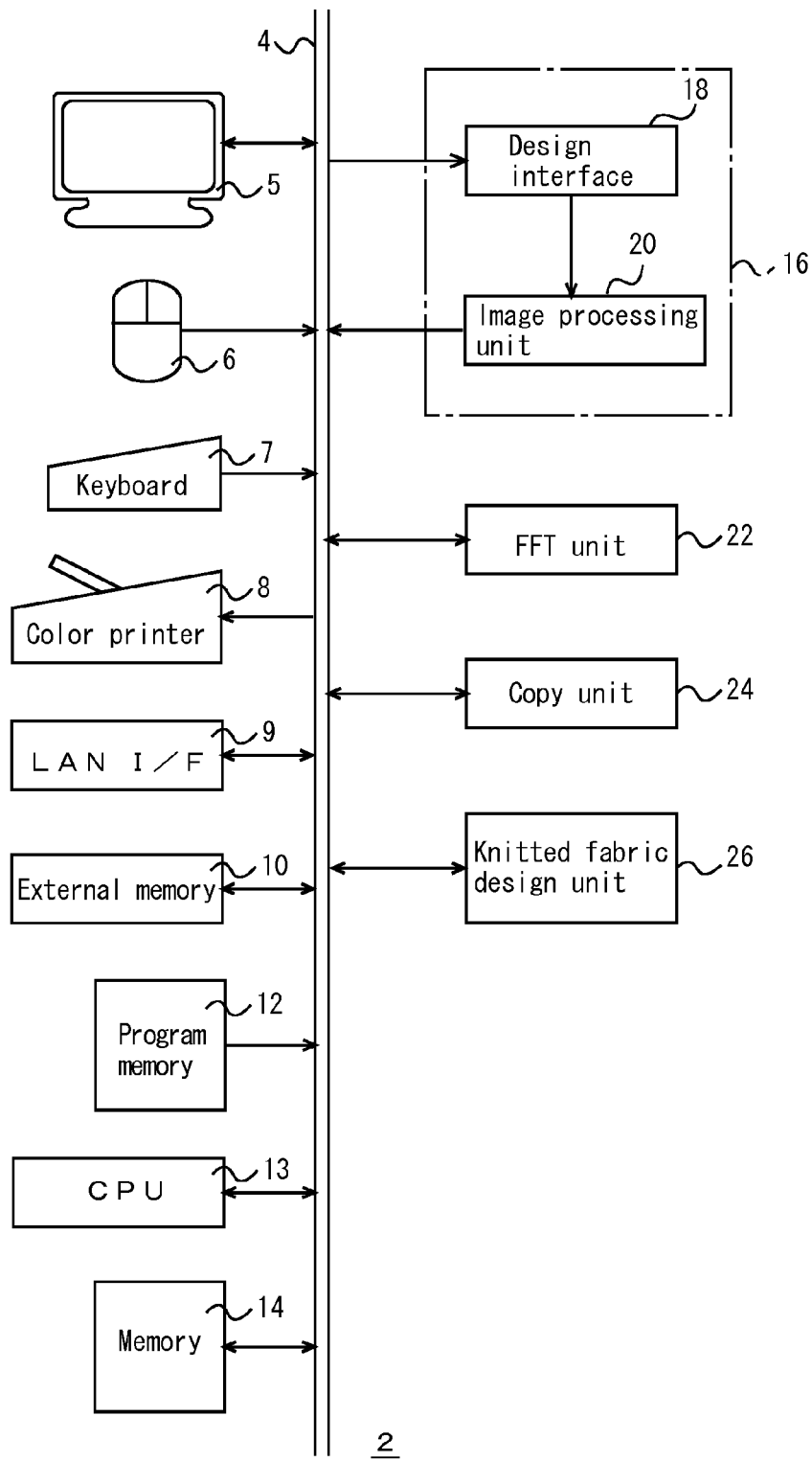
FIG. 1 is a block diagram illustrating a pattern creating apparatus according to an embodiment.

Hereinafter, the best mode for implementing the invention will be described.

Embodiment

FIGS. 1 to 8(*l*) show a pattern creating apparatus 2, a pattern creating method, and examples of patterns according to the present embodiment. In the pattern creating apparatus 2 of FIG. 1, the reference numeral 4 denotes a bus, the reference numeral 5 denotes a color monitor, and the reference numeral 6 denotes a pointing device, which is a mouse, a stylus, a trackball, or the like. The reference numeral 7 denotes a keyboard, the reference numeral 8 denotes a color printer, the reference numeral 9 denotes a LAN interface, and the reference numeral 10 denote an external memory, which is a USB, a removable disk, or the like. The reference numeral 12 denotes a program memory, the reference numeral 13 denotes a CPU, and the reference numeral 14 denotes a memory, in which data during a pattern creating process and the created pattern, knitting data, yarn design data, and the like are stored.

The reference numeral 16 denotes a pattern creating unit, which includes a design interface 18 that accepts inputs of parameters associated with pattern creation, and an image processing unit 20 that creates patterns based on the accepted parameters. An FFT unit 22 performs a two-dimensional fast Fourier transformation (two-dimensional FFT), a one-dimensional fast Fourier transformation (one-dimensional FFT), or the like on the created patterns, and obtains data on the cyclicity of the patterns, such as a frequency spectrum. If a user has configured settings such that, for example, line segments having random lengths are arranged, most of the created patterns have low regularity or cyclicity. In this case, the FFT unit 22 extracts, from these patterns, a pattern that has strong cyclicity. A frequency distribution by FFT indicates the strength of cyclicity of patterns. Instead of FFT, the discrete cosine transformation, or the like may be used to obtain frequency components. The reciprocal numbers of the frequency components indicate the lengths in which cyclicity is present, and concentrated frequency components in a specific range indicate that cyclicity is strong, and distributed frequency components in a wide range indicate that cyclicity is weak. Alternatively, the length in which cyclicity is present may be obtained by calculating an autocorrelation coefficient and, in this context, the length in which cyclicity is present indicates a cycle in which patterns repeat, and the value of the autocorrelation coefficient indicates the strength of regularity. The FFT unit 22, a discrete cosine transform unit, an autocorrelation coefficient calculation unit, or the like is referred to as a frequency analyzing unit.

Figure 3:
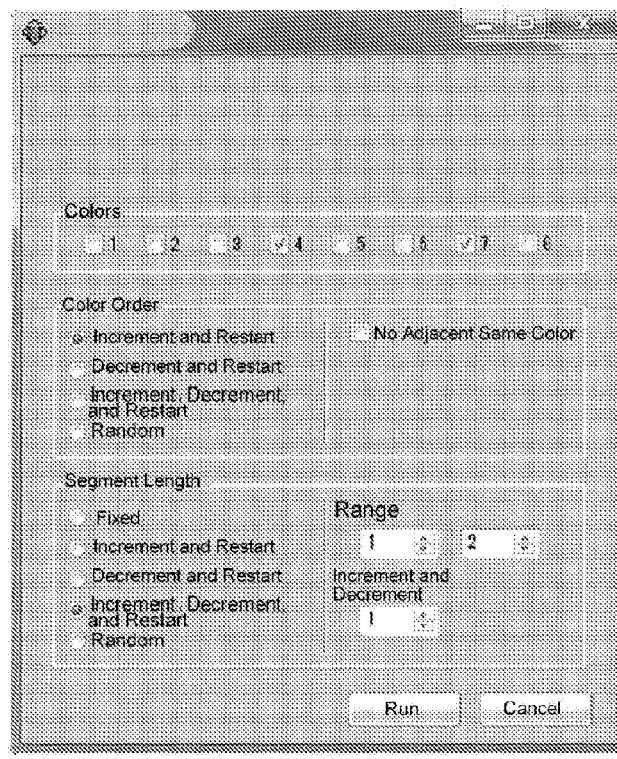
FIG. 3 is a diagram illustrating a setting image associated with pattern creation.
Figure 6:
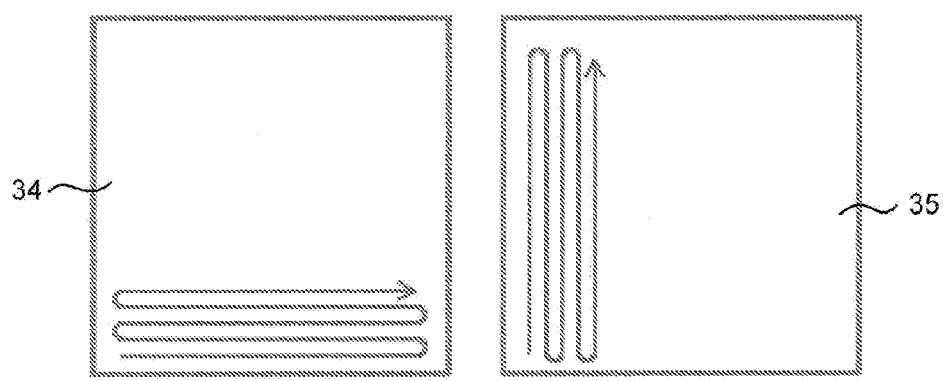
FIG. 6 is a diagram illustrating examples of rules of the drawing direction.
Figure 6:
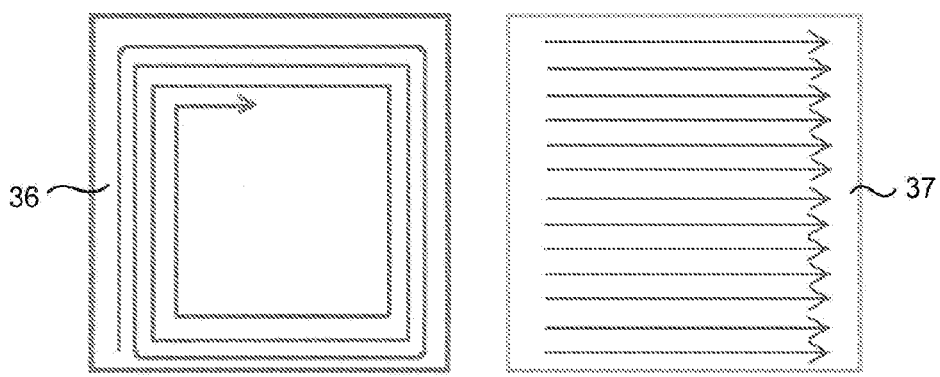
Figure 6:
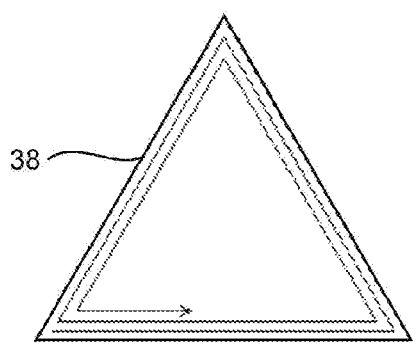
Figure 8:
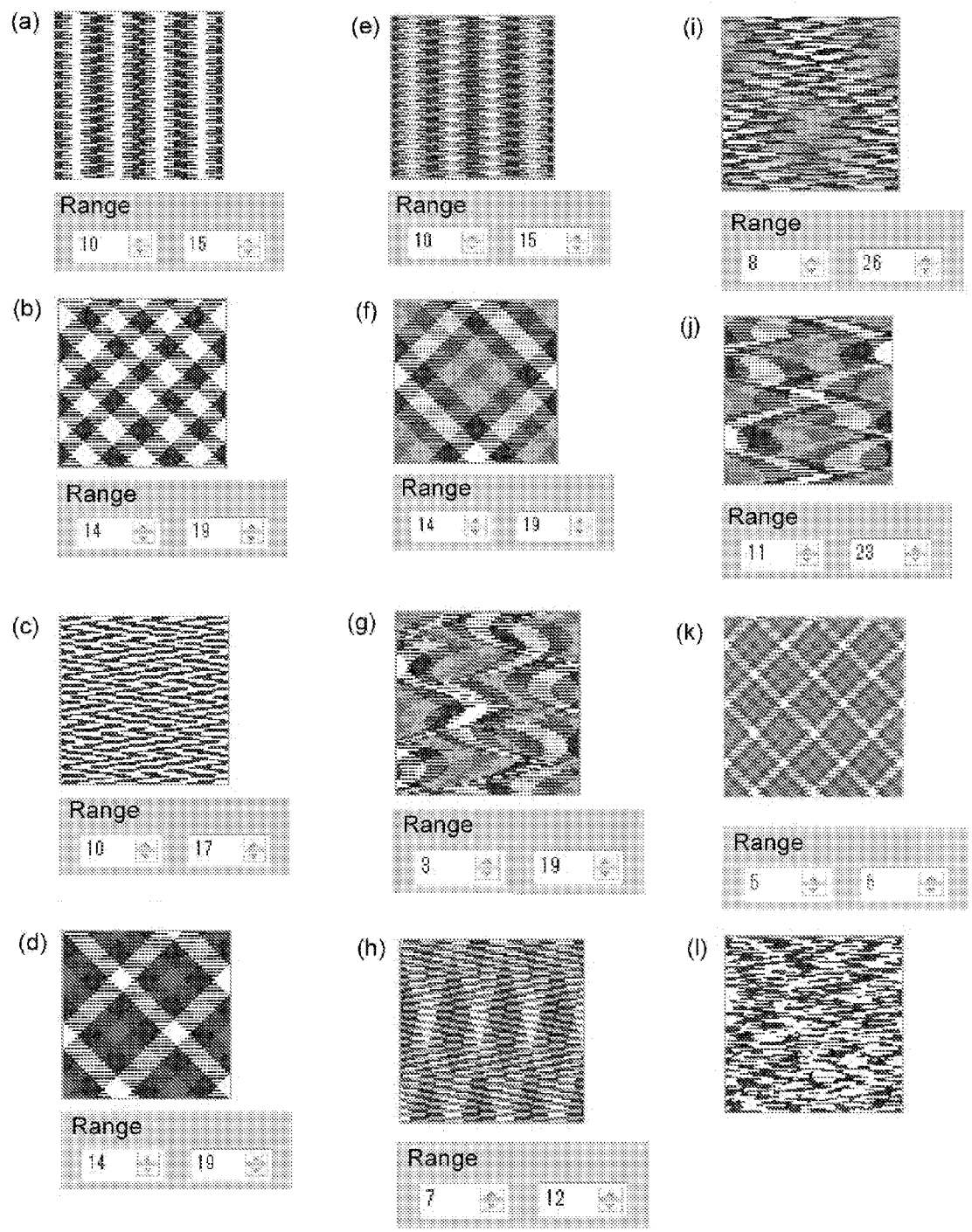
FIGS. 8(a) to 8(l) illustrate examples of patterns: specifically.

Based on each of rules 34 and 37 of FIG. 6, lines according to the color use order and the line segment length that were input via a setting image 28 of FIG. 3 are arranged in parallel to each other in the lateral direction. Since data obtained by performing Fourier transformation with respect to patterns along the lateral direction is of low importance, Fourier transformation along the lateral direction may be omitted, and only Fourier transformation along the vertical direction may be performed. In the case of a rule 35, Fourier transformation along the vertical direction may be omitted, and only Fourier transformation along the lateral direction may be performed.

Returning to FIG. 1, a copy unit 24 cuts a region designated by the user from the created patterns and copies the cut region onto an area of design data of apparel, such as a knitted fabric, a cloth, clothing, or the like that is designated by the user. If the region is larger than the designated area, the region in a range common with the designated area is effectively copied. If the region is smaller than the designated area, the region is arranged in a repeated manner in accordance with the user's instruction so as to fill up the designated area. The copied pattern slightly differs from the original pattern, and the copy unit 24 stores the copied pattern as well. If the created patterns are expressed on apparel by performing printing, that is, if the patterns are used as patterns for dyeing, the copy unit 24 performs copying such that the designated region is arranged in a repeated manner, and the resulting patterns serve as print data.

In order for a knitting machine, such as a flat knitting machine, a circular knitting machine, a warp knitting machine, or the like to knit a knitted fabric, a knitted fabric design unit 26 supports the design of the knitted fabric, and converts design data of the knitted fabric into knitting data, which is operational data of the knitting machine. The knitted fabric design unit 26 is not essential.

Figure 2:
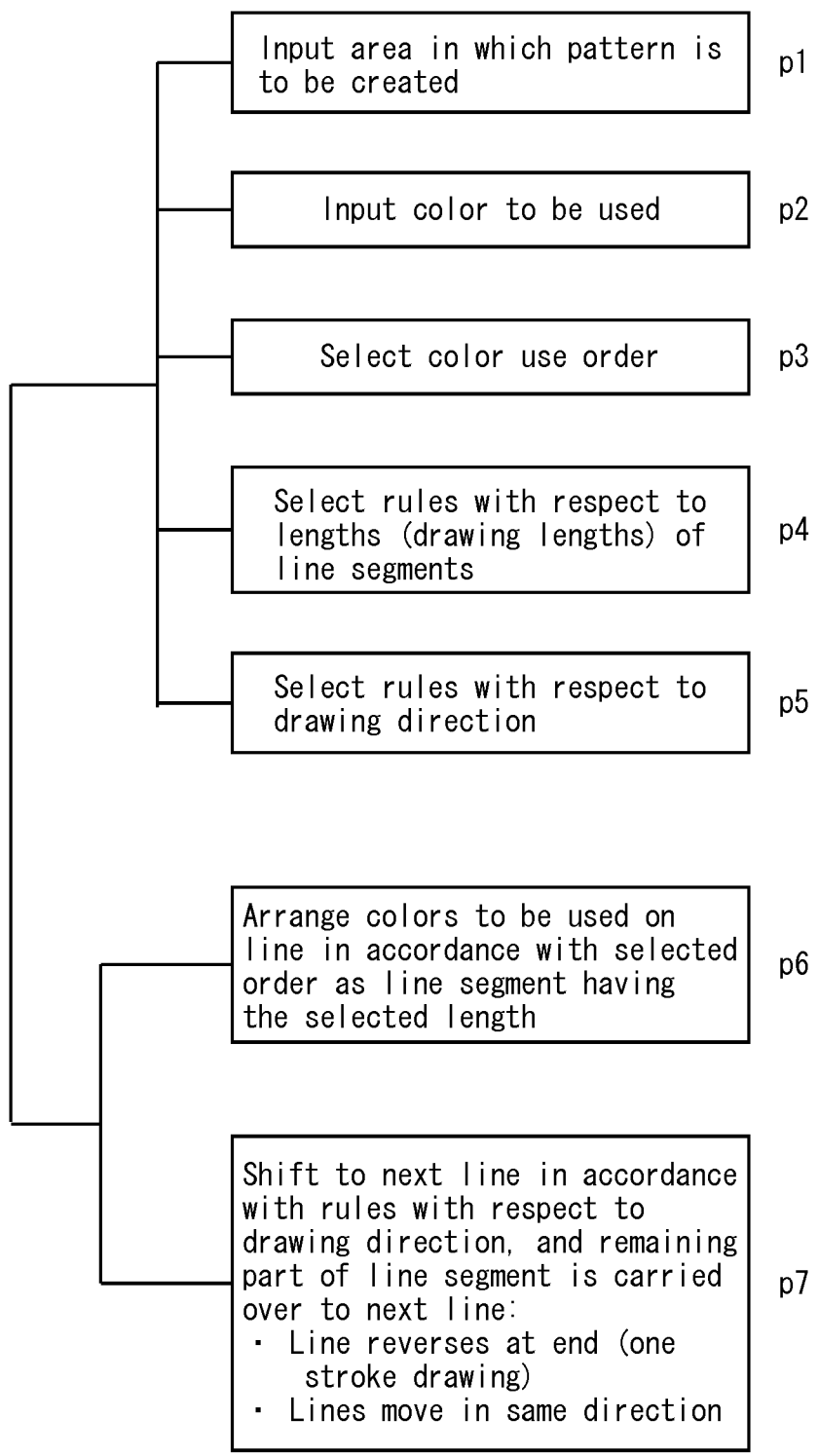
FIG. 2 is a diagram illustrating a pattern creation algorithm according to the embodiment.

FIGS. 2 to 6 show pattern creation according to the embodiment. FIG. 2 shows processes in a pattern creation algorithm, and FIG. 3 shows the setting image 28 for setting pattern creation parameters. In a process p1, a user inputs an area in which a pattern is to be created, or selects the area from a prepared group of candidates. A predetermined area is used as a default. The area may have the shape of a closed plane shape and be whole or part of apparel, for example, a knitted fabric or the like, the inside of a circle, or the like, and is preferably a polygon, such as a quadrangle, in which lines are arranged so as to fill up the inside thereof. In a process p2, colors to be used are input, and in FIG. 3, for example, up to eight colors are available for use, and colors of color numbers 4 and 7 are selected as colors to be used.

Figure 4:
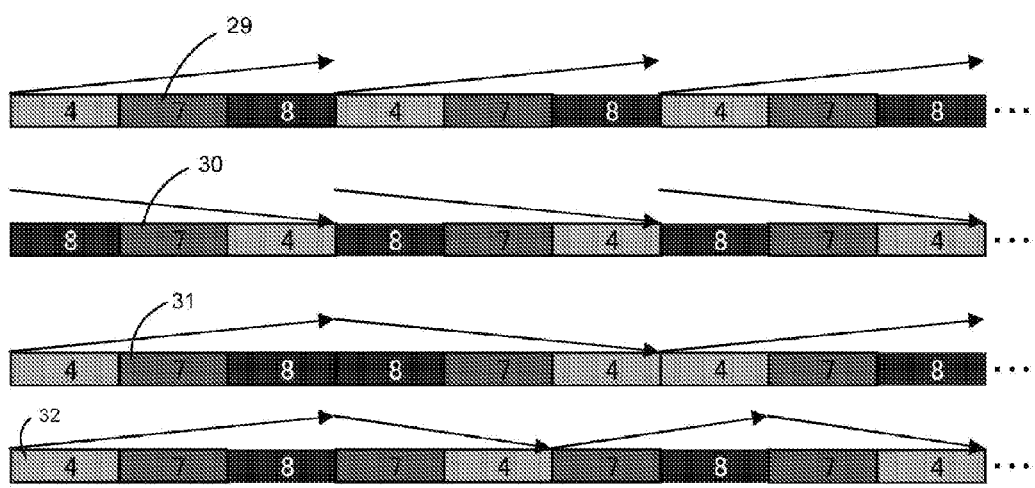
FIG. 4 is a diagram illustrating color use orders.

A color use order is selected (process p3). FIG. 4 shows, assuming that three colors having the color numbers of 4, 7, and 8 are used and the drawing length (the length of each line segment of one color) is fixed, settings 29 to 32 of orders in which the colors repeat (color use orders). The "Increment and Restart" 29 at the head of FIG. 4 shows the order in the direction in which the color number is incremented, indicating that the colors are to be used in the order of "... 4→7→8→4→7→8...". The "Decrement and Restart" 30 in the middle of the drawing shows the order in the direction in which the color number is decremented, indicating that the colors are to be used in the order of "... 8→7→4→8→7→4...". In the "Increment, Decrement, and Restart" 31 in the lower portion of the drawing, incrementing and subsequent decrementing the color number in a range of the colors to be used are repeated, indicating that the colors are to be used in the order of, for example, "... 4→7→8→8→7→4→4→7→8...". Note that "Decrement, Increment, and Restart" in which the color number is decremented and subsequently incremented may be applied. In the order of "... 4→7→8→8→7→4→4→7→8...", the color numbers 4 and 8 may appear twice consecutively. In the case of the "Increment, Decrement, and Restart" setting 32 that prohibits the same colors from being consecutive, the colors are to be used in the order of "... 4→7→8→7→4→7→8...". By selecting one of the use order settings 29 to 32, it is possible to designate in which order colors to be used appear in a line that is obtained by connecting line segments. Note that in "Random" setting, a color use order is randomly determined.

Figure 5:
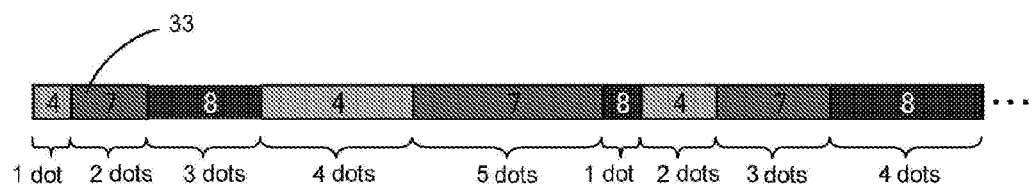
FIG. 5 is a diagram illustrating examples of lengths (drawing lengths) of line segments.

As a drawing length, a length of a line segment of one color is selected (process p4), and in FIG. 4, this length is fixed. In drawing length settings of "Increment and Restart", "Decrement and Restart", and "Increment, Decrement, and Restart", a range in which the length is changed, and an increment/decrement, which is a unit by which the length is changed, are designated. In drawing length setting of "Random", a range in which the length is changed is designated. The drawing length is set to "Increment and Restart", "Decrement and Restart", or "Increment, Decrement, and Restart", the length of the line segment is incremented or decremented for each color by the increment/decrement, the length of the line segment is changed in a range between the lower limit and the upper limit that are designated by "range designation". In a setting 33 of FIG. 5, the drawing length is set to "Increment and Restart", a range is set to from 1 to 5, the increment/decrement is set to 1, and the color order is set to "Increment and Restart". The configuration of the line segments in FIG. 5 is shown as follows:

... (4, 1)→(7, 2)→(8, 3)→(4, 4)→(7, 5)→(8, 1)→(4, 2)→(7, 3)→(8, 4)→(4, 5)→(7, 1)→(8, 2) ...

where the former number of each line segment denotes the color number, and the latter number denotes the dot number. Specifically, (4, 1) shows a line segment that has the color number of 4, and the length of 1. One dot may be regarded as a unit of the length and width of a line segment, or anything else.

A rule of the drawing direction is selected as shown, for example, FIG. 6 (process p5). With the rule 34, one stroke drawing is made in the lateral direction, and when a line reaches one of the right and left ends of the area, the line is reversed and moves in the reverse direction, and when the line reaches the other of the right and left ends of the area, the line is reversed again. Note, here, that a position at which a direction of a line is reversed is generally not located at a border between line segments. In the case where a line is reversed on the way of a line segment, the remaining part of the line segment is arranged at the head of the next line, thereby arrangement of line segments being varied between lines. Therefore, in the area, a pattern is created that is defined according to the rules relating to numbers of colors to be used, the use order of the colors, and the drawing length, and has both some degrees of cyclicity and some degrees of irregularity.

With the rule 35, one stroke drawing is made in the vertical direction, and with the rule 36, one stroke drawing is made spirally. In this case, a line diverts its direction by 90 degrees when reaching an already arranged line, and with the rule 37, when a line reaches the right end of the area, the drawing returns to the left end of the area and the next line is arranged. Also in this case, the remaining part of the line segment at the right end is arranged at the left end of the next line. The shape of the area is not limited to a quadrangle, and may be a triangle as with in the rule 38, a hexagon, or the like. One stroke drawing may be made spirally in the inside of the area of a circle.

Returning to FIG. 2, processes p6 and p7 for executing drawing will be described. According to the settings of the processes p1 to p5, colors to be used are arranged in lines in the selected order and with the selected line segment length (process p6). Since the length of one line in an area does commonly not correspond to a cycle in which line segments repeat, the end of the line is commonly located on the way of a line segment. Accordingly, the remaining part (part that has not been drawn) of the line segment is carried over to the next line. With respect to a next line, it is defined such that, for example, a line is reversed at an end of an area, and moves in the reverse direction as the next line, or the drawing returns to the opposite starting end of the area so that lines move in the same direction (process p7).

FIG. 7 shows an example of use of the pattern creating apparatus 2. The reference numeral 50 denotes a knitting machine such as a flat knitting machine, and the reference numeral 40 denotes a splicer that connects and changes yarns from a plurality of yarn sources 42. However, the splicer may be replaced by a dyeing machine. Knitting is performed by driving the knitting machine 50 based on knitting data generated by the pattern creating apparatus 2, and connecting and changing multiple yarns by the splicer 40 so that the color is changed for a unit of stitches. In the data of created patterns, the number of colors to be used, the use order of the colors, and the drawing length are designated.

If patterns are copied onto a part of a knitted fabric that is designated by the user, the color use order and the drawing length slightly change due to a balance of the size between the patterns and the part designated by the user. The color use order and the drawing length after the copying are stored in the copy unit 24, and the splicer 40 is controlled based on this data so as to connect and change yarns according to the color use order and the drawing length after the copying, thereby performing knitting. Therefore, a knitted fabric with colors is knitted by the knitting machine 50, without using an intarsia machine, a Jacquard machine, or the like. Note that a knitted fabric with colors may be obtained by an intarsia machine, a Jacquard machine, or the like, without providing the splicer 40 or the like.

FIGS. 8(a) to 8(k) show examples of created patterns. Note that an increment/decrement is, for example, 1; the use order and the drawing length are set to, for example, "Increment, Decrement, and Restart"; and the number of colors to be used is two to four. By changing a range of the drawing length, various types of patterns are created. Stripe patterns are created in FIGS. 8(a) and 8(e), check patterns are created in FIGS. 8(b), 8(d), and 8(f), and wave patterns is created in FIGS. 8(g) and 8(j). Also, a pattern with weak cyclicity is created in FIG. 8(c). FIG. 8(l) shows an example in which the drawing length is randomly designated. Note that if a pattern with strong cyclicity is needed, frequency analysis may be performed using the FFT unit 22, and only patterns in which frequency spectra are concentrated in a narrow range may be extracted and output onto the color monitor 5, or the like.

The embodiment achieves the following effects:

1) Various types of patterns are dialogically and easily created;

2) A number of patterns are created by changing parameters while displaying a created pattern on the color monitor 5;

3) Various types of patterns encompassing patterns like checks and stripes, patterns like waves etc., random patterns, and the like; and 4) Only a pattern with strong cyclicity is extracted by frequency analysis such as Fourier transformation.

Note that colors to be used may not only literally mean colors but also be, for example, color codes indicating types of stitches, or the like. Accordingly, it is possible to express pattern by knit structure obtained by combining face stitches, back stitches, miss stitches, and the like on a knitted fabric. Note that a predetermined area is not limited to an area defined by a contour, such as a rectangle. If it is designated that lines reverse at predetermined lengths, a pattern is obtained in a specified area, which is included in the predetermined area.

DESCRIPTION OF REFERENCE NUMERALS

2 Pattern creating apparatus
4 Bus

5 Color monitor
6 Pointing device
7 Keyboard
8 Color printer
9 LAN interface
10 External memory
12 Program memory
13 CPU
14 Memory
16 Pattern creating unit
18 Design interface
20 Image processing unit
22 FFT unit
24 Copy unit
26 Knitted fabric design unit
28 Setting image
29 to 33 Settings
34 to 38 Rule
40 Splicer
42 Yarn source
44 Lily-yarn knitting machine
50 Knitting machine

What is claimed is:

1. A pattern creating apparatus comprising:

a setting unit that creates a setting image for accepting settings of color parameters relating to a plurality of colors, and length parameters relating to lengths of line segments of the respective colors, and accepts an input of a user; and an image processing unit that creates a line having the plurality of colors by connecting the line segments of the respective colors to each other that respectively have the colors according to the color parameters and the lengths according to the length parameters, and creates a pattern with multiple lines by arranging the created line in a repeated manner in a predetermined area, wherein the area is a polygon, and the image processing unit is configured to arrange the line in parallel to a side of the area, to change a direction of the line or start a new line when the line reaches an end of the area, or an already arranged line, and to arrange a remaining part of a length of a line segment at the time of the change of the direction or the start of the new line as a first line segment of the line after the change or the start.

2. The pattern creating apparatus according to claim 1, further comprising a copy unit that extracts a region designated by the user from the created pattern, and copies the extracted region onto a design of a product.

3. The pattern creating apparatus according to claim 1, further comprising a frequency analyzing unit that performs frequency analysis on the created pattern in a case where length parameters are set such that the lengths of the line segments of the respective colors are defined by the pattern creating apparatus.

4. A pattern creating method comprising the steps for:

accepting, via a setting image, settings of color parameters relating to a plurality of colors, and length parameters relating to lengths of line segments of the respective colors; and causing an image processing unit to create a line having the plurality of colors by connecting the line segments of the respective colors to each other that respectively have the colors according to the color parameters and the lengths according to the length parameters, and to create a pattern with multiple lines by arranging the created line in a repeated manner in a predetermined area, wherein the area is a polygon, and the image processing unit is configured to arrange the line in parallel to a side of the area, to change a direction of the line or start a new line when the line reaches an end of the area, or an already arranged line, and to arrange a remaining part of a length of a line segment at the time of the change of the direction or the start of the new line as a first line segment of the line after the change or the start.

* * * * *